US006784737B2

(12) United States Patent
Martin et al.

(10) Patent No.: US 6,784,737 B2
(45) Date of Patent: Aug. 31, 2004

(54) VOLTAGE MULTIPLIER CIRCUIT

(75) Inventors: Aaron K. Martin, Hillsboro, OR (US); David J. Comer, Springville, UT (US)

(73) Assignee: Intel Corporation, Santa Clara, CA (US)

( * ) Notice: Subject to any disclaimer, the term of this patent is extended or adjusted under 35 U.S.C. 154(b) by 197 days.

(21) Appl. No.: 10/021,864

(22) Filed: Dec. 17, 2001

(65) Prior Publication Data

US 2003/0112644 A1 Jun. 19, 2003

(51) Int. Cl.[7] .............................................. H03F 3/45
(52) U.S. Cl. ..................................... 330/257; 330/253
(58) Field of Search .............................. 330/257, 288, 330/253; 323/315, 316; 341/165, 155, 144

(56) References Cited

U.S. PATENT DOCUMENTS

| 4,459,555 A | * | 7/1984 | Jett, Jr. ....................... 330/253 |
| 4,853,610 A | * | 8/1989 | Schade, Jr. .................. 323/316 |
| 5,455,522 A | * | 10/1995 | Jones ........................... 326/27 |
| 6,597,303 B2 | * | 7/2003 | Cosand ....................... 341/165 |

OTHER PUBLICATIONS

IEEE, Ota extended adjustment range and linearization via programmable current mirrors.*
Comer, D.T., et al., "A CMOS Voltage to Current Converter For Low Voltage Applications", *This information is directly from Donald T. Comer's web site*.http://www.ee.byu.edu/faculty/comerdt/publications.html, 13 p., (Feb. 11, 1997).
Farjad–Rad, R., et al., "A 0.4–um CMOS 10–Gb/s 4–PAM Pre–Emphasis Serial Link Transmitter", *IEEE Journal of Solid–State Circuits*, 34 (5), pp. 580–585, (May 1999).

* cited by examiner

*Primary Examiner*—Henry Choe
(74) *Attorney, Agent, or Firm*—Schwegman, Lundberg, Woessner & Kluth, P.A.

(57) ABSTRACT

A voltage multiplier circuit includes a voltage-to-current converter, a current multiplier, and load devices. The voltage-to-current converter receives a differential input voltage, and produces a differential current. The differential current is received by the current multiplier, which produces a scaled output current. The amount of scaling is provided by a digital control word. Load devices produce a differential output voltage from the scaled output current. Multiple voltage-to-current converters and current multipliers can be coupled in parallel so that the scaled output currents sum.

16 Claims, 4 Drawing Sheets

VOLTAGE MULTIPLIER CIRCUIT

FIELD

The present invention relates generally to amplifiers, and more specifically to amplifiers with programmable gain.

BACKGROUND

Amplifiers are commonly used to produce an output voltage or an output current in response to an input voltage or an input current. Voltage amplifiers receive an input voltage and produce an output voltage. Current amplifiers receive an input current and produce an output current. Other types of amplifiers also exist. For example, a transconductance amplifier receives an input voltage and produces an output current.

FIG. 1 shows a prior art amplifier circuit. Amplifier circuit 100 includes operational amplifier (op-amp) 102, feedback resistor ($R_f$) 104, and input resistors ($R_1$, $R_2$) 106 and 108. Amplifier circuit 100 produces an output voltage ($V_{OUT}$) on node 110 from input voltages ($V_{IN1}$, $V_{IN2}$) on nodes 112 and 114. The output voltage satisfies the following equation:

$$V_{OUT} = \left(\frac{-R_f}{R_1}\right)V_{IN1} + \left(\frac{-R_f}{R_2}\right)V_{IN2} \quad (1)$$

As shown in equation (1) above, amplifier circuit 100 scales (or "multiplies") each input voltage by a constant value and sums the scaled voltage values. The constant values used to scale the input voltages are equal to a ratio of resistance values. By varying the resistance values of resistors 104, 106, and 108, the input voltage scaling can be changed.

As is known in the art, amplifier circuit 100 has many uses. It is also known in the art that amplifier circuit cannot operate at extremely high frequencies, in part because op-amp 102 usually includes compensation circuits to avoid instability, and these compensation circuits tend to limit the frequency at which the op-amp can operate.

Other example circuits that provide voltage multiplication include the "Gilbert cell" as described in chapter eight of: David A Johns & Ken Martin, "Analog Integrated Circuit Design," (1997).

For the reasons stated above, and for other reasons stated below which will become apparent to those skilled in the art upon reading and understanding the present specification, there is a need in the art for methods and apparatus to provide amplifiers and multipliers that operate at high frequencies.

DESCRIPTION OF EMBODIMENTS

Figure 1:
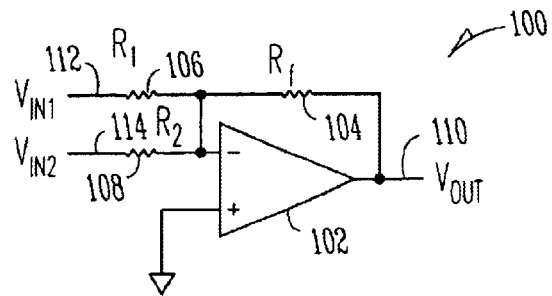
FIG. 1 shows a prior art voltage amplifier.

In the following detailed description of the embodiments, reference is made to the accompanying drawings which show, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. Moreover, it is to be understood that the various embodiments of the invention, although different, are not necessarily mutually exclusive. For example, a particular feature, structure, or characteristic described in one embodiment may be included within other embodiments. The following detailed description is, therefore, not to be taken in a limiting sense, and the scope of the present invention is defined only by the appended claims, along with the full scope of equivalents to which such claims are entitled.

Figure 2:
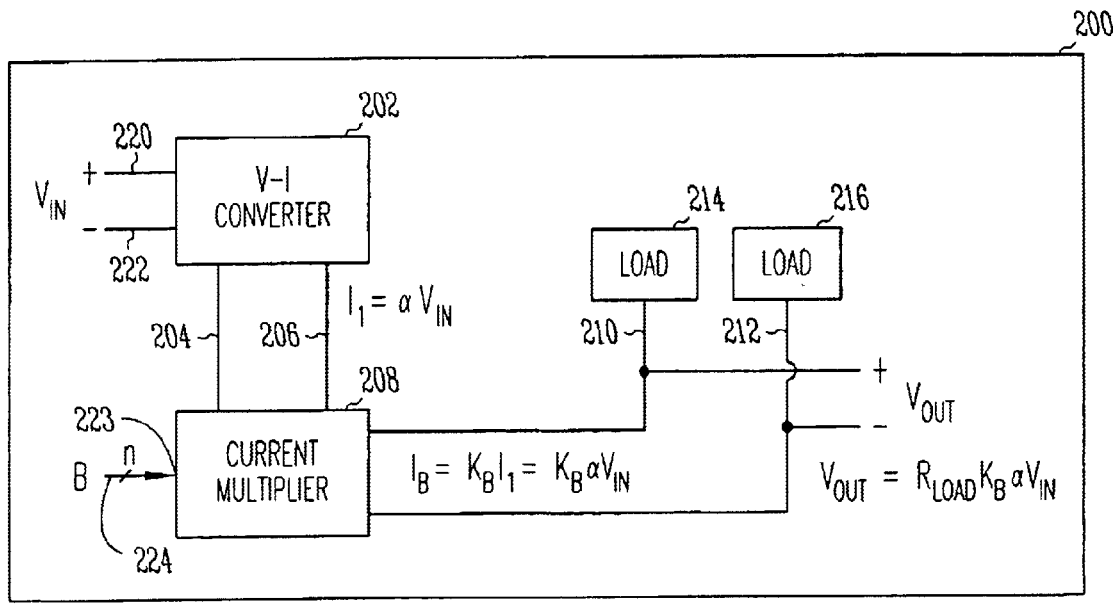
FIG. 2 shows an integrated circuit with a voltage multiplier.

FIG. 2 shows an integrated circuit with a voltage multiplier. Integrated circuit 200 includes voltage-to-current (V-I) converter 202, current multiplier 208, and load devices 214 and 216. The combination of V-I converter 202, current multiplier 208, and load devices 214 and 216 forms a voltage multiplier where $V_{OUT}$ is a multiple of $V_{IN}$, $V_{IN}$ is a differential input voltage impressed on nodes 220 and 222. V-I converter 202 converts the differential input voltage to a differential current on nodes 204 and 206. Current multiplier 208 receives the differential input current on nodes 204 and 206, and produces a differential output current on nodes 210 and 212. Load devices 214 and 216 receive the currents on nodes 210 and 212, and produce the differential output voltage $V_{OUT}$.

In some embodiments, V-I converter 202 produces a differential output current ($I_1$) on nodes 204 and 206 that varies linearly with changes in the input voltage $V_{IN}$. For example, as shown in FIG. 2, the current on nodes 204 and 206 satisfies the equation:

$$I_1 = \alpha V_{IN} \quad (2)$$

where $\alpha$ is a constant. In some embodiments, $I_1$ is substantially linear over a wide range of differential input voltage values. Example embodiments of a V-I converter are described with reference to FIG. 3 below.

Current multiplier 208 includes an input side, an output side, and a digital input port. The input side of current multiplier 208 is coupled to V-I converter 202 through nodes 204 and 206; the output side is coupled to load devices 214 and 216 through nodes 210 and 212; and digital input port 223 is coupled to node 224.

Current multiplier 208 produces a differential output current on nodes 210 and 212. The differential output current on nodes 210 and 212 is equal to the differential current on nodes 204 and 206 scaled by a scale factor ($K_B$). For example, the differential output current on nodes 210 and 212 satisfies the equation:

$$I_B = K_B I_1 = K_b \alpha V_{IN} \quad (3)$$

The scale factor is controlled by a digital word (B) on node 224. Node 224 is shown as "n" bits wide to signify that any number of bits can be included in the digital word B. As the value of B is increased, $K_B$ is increased, and the differential output current on nodes 210 and 212 is also increased. Likewise, when the value of B is decreased, $K_B$ is decreased, and the differential output current on nodes 210 and 212 is also decreased. Example embodiments of a current multiplier are discussed below with reference to FIGS. 3 and 4.

Load devices 214 and 216 develop voltages on nodes 210 and 212 as a result of differential current $I_B$. In some embodiments, load devices 214 and 216 produce a differential output voltage $V_{OUT}$ that varies linearly with variations in differential current $I_B$. In these embodiments, the output voltage satisfies the equation:

$$V_{OUT} = R_{LOAD} I_B = R_{LOAD} K_B \alpha V_{IN} \quad (4)$$

where $R_{LOAD}$ is equal to the equivalent resistance of load devices 214 and 216. In some embodiments, load devices 214 and 216 are resistors with a resistance value of $R_{LOAD}$. In other embodiments, load devices 214 and 216 are active devices such as transistors with an equivalent resistance value of $R_{LOAD}$.

The voltage multiplier shown in FIG. 2 is a fully differential system. For example, the input and output voltages are differential, as are the currents on internal nodes. By being fully differential, common mode effects can be substantially ignored. For example, in embodiments represented by FIG. 2, the output voltage has a common mode component, but the effects of the common mode component are substantially ignored because the output voltage is measured as a difference between two nodes.

In some embodiments, the voltage multiplier is a single-ended system. In these embodiments, V-I converter 202 receives an input voltage on a single node and produces a current on one node. Current multiplier 208 receives one current and produces a multiplied output current on a single node, and one load device produces a single ended output voltage. Single-ended embodiments are useful in systems that can tolerate common mode variations in the output voltage.

In other embodiments, the voltage multiplier is a combination of differential and single-ended systems. For example, in some embodiments, a differential input voltage is received, but a single-ended current is produced by the V-I converter and a single load device is utilized to produce a single-ended output voltage. In other embodiments, a single-ended input voltage is received, and differential currents are produced to provide a differential output voltage.

Figure 3:
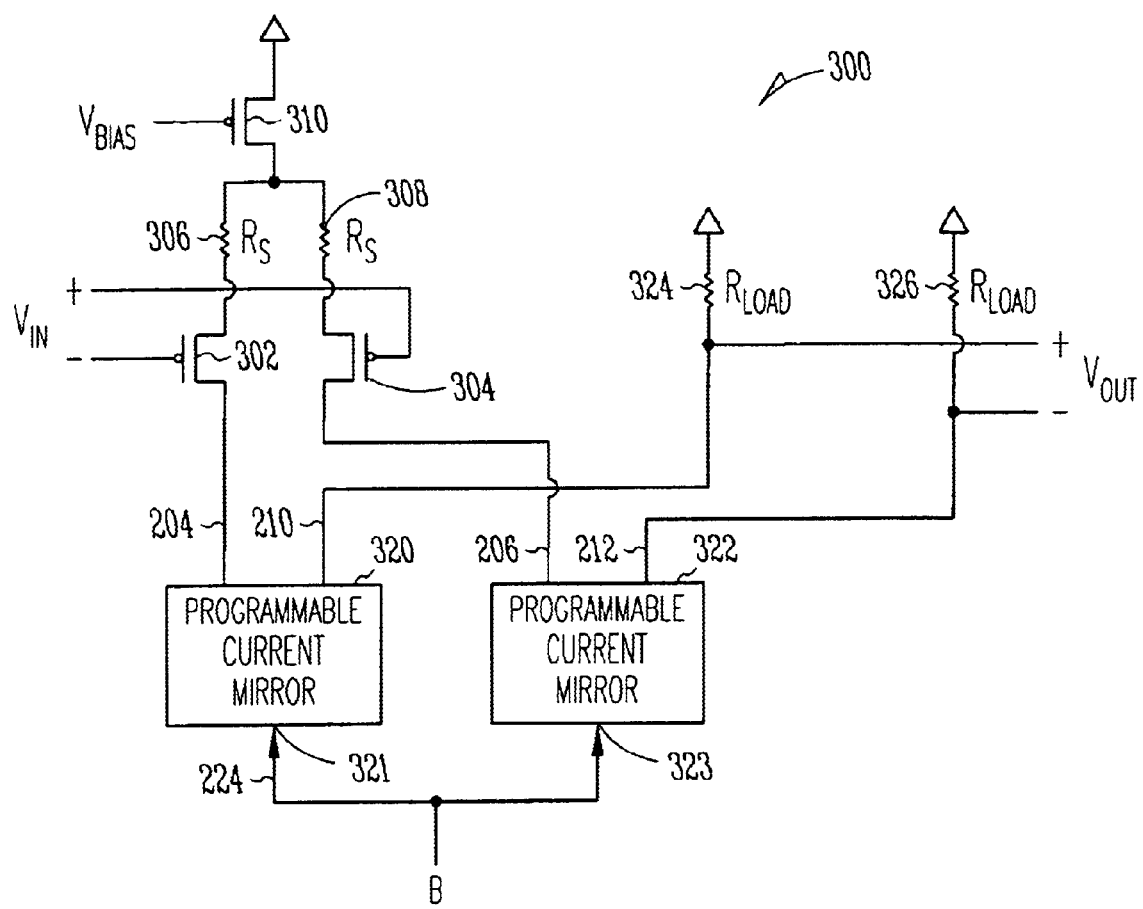
FIG. 3 shows a voltage multiplier.

FIG. 3 shows a voltage multiplier. Voltage multiplier 300 includes transistors 302, 304, and 310, programmable current mirrors 320 and 322, and load resistors 324 and 326. Voltage multiplier 300 represents embodiments of the voltage multiplier circuit within integrated circuit 200 (FIG. 2). Transistors 302, 304, and 310 form a V-I converter corresponding to V-I converter 202 (FIG. 2); programmable current mirrors 320 and 322 correspond to current multiplier 208 (FIG. 2); and load resistors 324 and 326 correspond to load devices 214 and 216 (FIG. 2).

Transistors 302 and 304 form a differential pair of transistors that convert the input voltage $V_{IN}$ to a differential current on nodes 204 and 210. Transistor 310 is a tail current device that receives a bias voltage ($V_{BIAS}$) and sources a substantially constant current to the differential pair of transistors. As $V_{IN}$ is varied, the source-to-gate voltage on transistors 302 and 304 is varied, and the tail current from transistor 310 is varied between nodes 204 and 210.

In embodiments represented by FIG. 3, transistors 302, 304, and 310 are p-channel metal oxide semiconductor field effect transistors (PMOSFETs). In other embodiments, other types of transistors are used. For example, in some embodiments, junction field effect transistors (JFET) are used, and in other embodiments, bipolar junction transistors (BJT) are used. As used herein, the term "p-channel transistor" refers to any transistor having an p-doped channel. Transistors 302, 304, and 310 are examples of p-channel transistors.

Resistors 306 and 308 are source degeneration resistors. As current passes through resistors 306 and 308, a voltage drops across them, leaving a smaller voltage to drop between the source and gate of transistors 302 and 304. This can increase the useful input voltage swing. In some embodiments, resistors 306 and 308 are omitted. In these embodiments, an effect similar to that provided by resistors 306 and 308 can be provided by the source resistance of transistors 302 and 304.

In the embodiments represented by FIG. 3, the V-I converter utilizes p-channel transistors for both the tail current device and the differential pair of transistors. In other embodiments, n-channel transistors are used. For example, an n-channel tail current device can be coupled to a lower voltage supply node, and an n-channel differential pair of transistors can be coupled to the n-channel tail current device. As used herein, all descriptions of circuits that include p-channel transistors also describe equivalent circuits that utilize n-channel transistors.

As described above, transistors 302, 304, and 310 form a V-I converter that corresponds to V-I converter 202 (FIG. 2). The V-I converter shown in FIG. 3 represents but a few of the many V-I converter embodiments. In some embodiments, different V-I converter circuits are used. Any V-I converter embodiment can be utilized without departing from the scope of the present invention.

Programmable current mirrors 320 and 322 form a differential current multiplier corresponding to current multiplier 208 (FIG. 2). Programmable current mirror 320 receives an input current on node 204 from transistor 302, and produces an output current on node 210. Programmable current mirror 322 receives an input current on node 206 from transistor 304, and produces an output current on node 212. Programmable current mirrors 320 and 322 include digital input ports 321 and 323, respectively. Both digital input ports receive the digital control word B on node 224. As described above with reference to FIG. 2, the digital control word B controls the amount of current gain provided by programmable current mirrors 320 and 322. Example embodiments of programmable current mirrors are described with reference to FIG. 4 below.

Load resistors 324 and 326 are examples of load devices 214 and 216 (FIG. 2). In some embodiments, load resistors 324 and 326 are replaced with active devices, such as diode-connected transistors to provide a very high impedance load. In other embodiments, load resistors 324 and 326 are omitted, and voltage multiplier 300 becomes a transconductance multiplier that receives a voltage and produces a current. In these embodiments, the output of the circuit is the differential current provided on nodes 210 and 212.

Figure 4:
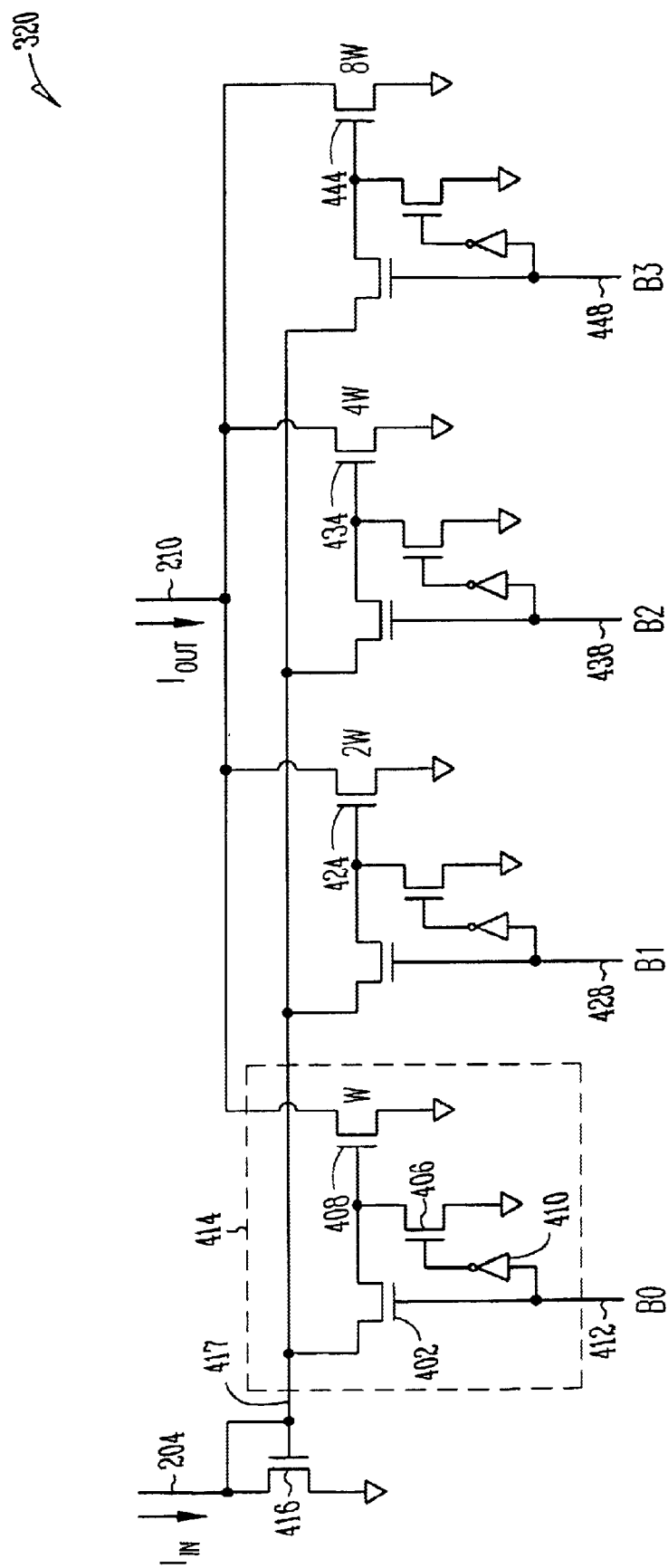
FIG. 4 shows a programmable current mirror.

FIG. 4 shows a programmable current mirror. Programmable current mirror 320 includes diode-connected control transistor 416 and current source transistors 408, 424, 434, and 444. The term "diode-connected" as used herein, refers to a transistor that has a gate tied to a drain, such that the gate-to-source voltage and the drain-to-source voltage are equal. Diode-connected transistor 416 receives the input current ($I_{IN}$) on node 204, and provides a bias voltage to the current source transistors on node 417. Each of current source transistors 408, 424, 434, and 444 are part of a selectable current source circuit. For example, current source transistor 408 is part of selectable current source circuit 414. Selectable current source circuit 414 also includes select transistors 402 and 406, and inverter 410. As shown in FIG. 4, select transistor 402 is coupled source-to-drain between the gate of control transistor 416 and the gate of current source transistor 408. Select transistor 408 is coupled source-to-drain between the gate of current source transistor 408 and a reference node.

Selectable current source circuit 414 is "selected" when signal B0 is asserted on node 412. When signal B0 is asserted, select transistor 402 turns on and select transistor 406 turns off, thereby providing the bias voltage on node 417 to current source transistor 408. When the bias voltage is provided to current source transistor 408, current source transistor 408 contributes to the output current ($I_{OUT}$) on node 210. Selectable current source circuit 414 is "deselected" when signal B0 is de-asserted on node 412. When B0 is de-asserted, select transistor 402 turns off and select transistor 406 turns on, thereby providing a reference potential to current source transistor, 408 and turning it off.

As shown in FIG. 4, programmable current mirror 320 includes four selectable current source circuits. The four selectable current source circuits are each controlled by one bit of the digital control word. For example, current source transistor 424 is controlled by signal B1 on node 428, current source transistor 434 is controlled by signal B2 on node 438, and current source transistor 444 is controlled by signal B3 on node 448. Nodes 412, 428,438, and 448 correspond to the "n" bits of node 224 (FIG. 3). The output current $I_{OUT}$ is equal to the sum of the currents provided by each current source transistor. The ratio of $I_{OUT}$ to $I_{IN}$ is referred to as the "current gain" of the programmable current mirror.

In embodiments represented by FIG. 4, current source transistors 408, 424, 434, and 444 are sized in a binary fashion. For example, transistor 408 has a size of "W," transistor 424 has a size of "2W," transistor 434 has a size of "4W," and transistor 444 has a size of "8W." In these embodiments, the current gain of programmable current mirror 320 increases linearly as the digital control word B counts up. In other embodiments, the current source transistors are sized in a fashion other than binary. For example, in some embodiments, each current source transistor is the same size. In these embodiments, the current gain increases linearly as the number of asserted bits in the digital control word increases linearly. Many other programmable current mirror embodiments exist, and these embodiments are intended to be within the scope of the present invention.

In embodiments represented by FIG. 4, programmable current mirror 320 is implemented using n-channel metal oxide semiconductor field effect transistors (NMOSFETs). Many embodiments of programmable current mirror 320 exist. In some embodiments, programmable current mirror 320 is implemented using bipolar transistors. In other embodiments, programmable current mirror 320 is implemented using junction field effect transistors (JFETs). Programmable current mirror 320 can be implemented in many other ways without departing from the scope of the present invention.

Figure 5:
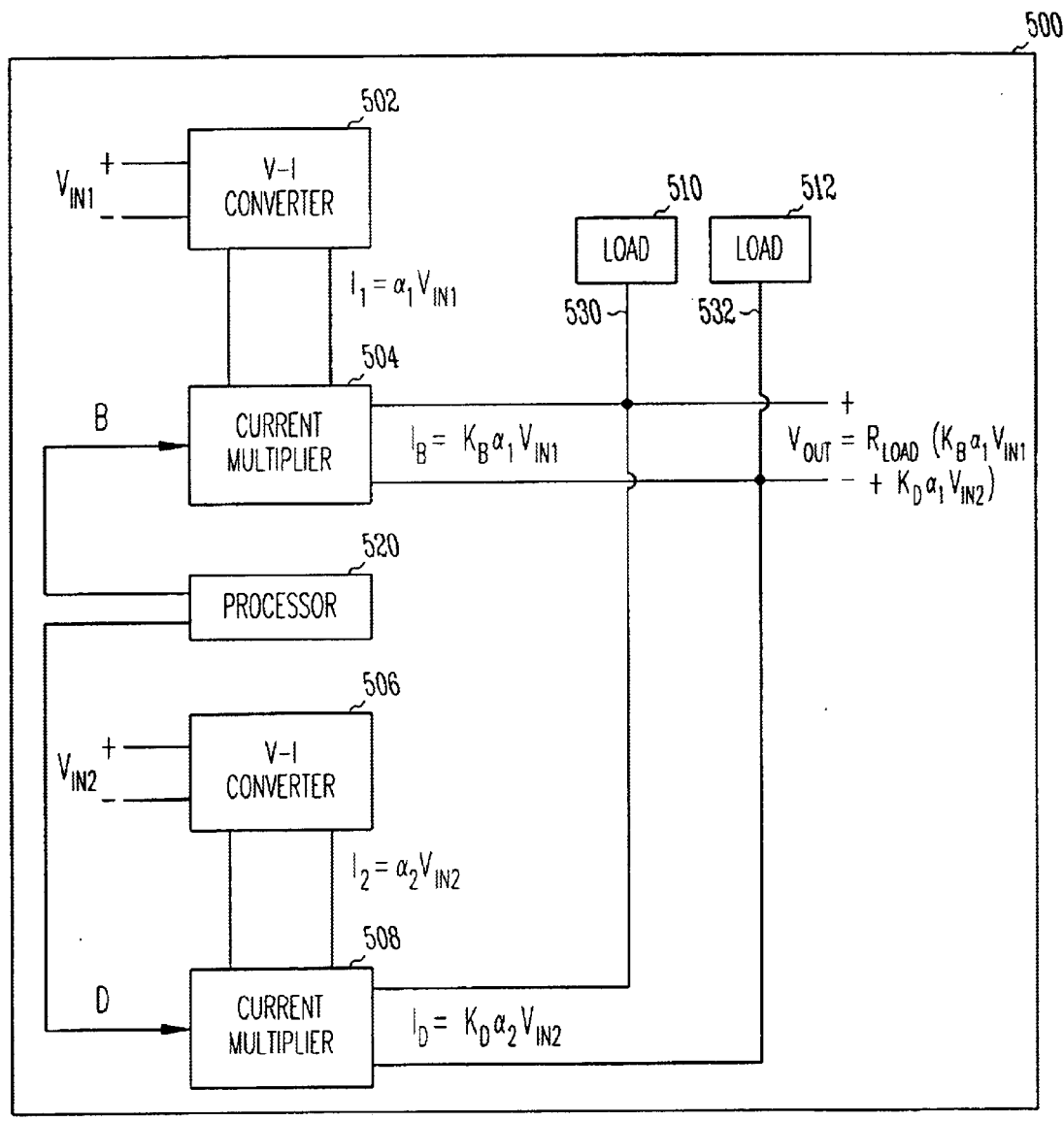
FIG. 5 shows an integrated circuit having a voltage multiplier with multiple inputs.

FIG. 5,shows an integrated circuit having a voltage multiplier with multiple inputs. Integrated circuit 500 includes V-I converters 502 and 506, current multipliers 504 and 508, load devices 510 and 512, and processor 520.

V-I converter 502 receives a differential input voltage ($V_{IN1}$) and outputs a differential current ($I_1$) that satisfies the following equation:

$$I_1 = \alpha_1 V_{IN1} \tag{5}$$

Current multiplier 504 receives the differential current $I_1$, and produces an output current ($I_B$) that satisfies the following equation:

$$I_B = K_B \alpha_1 V_{IN1} \tag{6}$$

V-I converter 506 receives a differential input voltage ($V_{IN2}$) and outputs a differential current ($I_2$) that satisfies the following equation:

$$I_2 = \alpha_2 V_{IN2} \tag{7}$$

Current multiplier 508 receives the differential current $I_2$, and produces an output current ($I_D$) that satisfies the following equation:

$$I_D = K_D \alpha_2 V_{IN2} \tag{8}$$

Current multipliers 504 and 508 each have differential output nodes that are coupled in common to output nodes 530 and 532. As a result, the output currents of current multipliers 504 and 508 sum at output nodes 530 and 532. Load devices 510 and 512 produce a differential voltage as a result of the differential output current. Assuming that the load devices have an impedance equal to $R_{LOAD}$, the differential output voltage equals:

$$V_{OUT} = R_{LOAD}(K_B \alpha_1 V_{IN1} + K_D \alpha_2 V_{IN2}) \tag{9}$$

As shown in equation (9) above, the voltage multiplier of FIG. 5 multiplies each input voltage by a constant value and sums the resulting voltage values. The constant values used to scale the input voltages are equal to a product of the gain of the corresponding V-I converter and current multiplier. By varying the gain of the V-I converters and the gain of the current multipliers, the input voltage scaling can be changed.

The current gain of current multiplier 504 is controlled by the digital word shown as "B," and the current gain of current multiplier 508 is controlled by the digital word shown as "D." Each of current multipliers 504 and 508 can be implemented using current multiplier embodiments described above, and can also be implemented using alternate current multiplier embodiments.

Integrated circuit 500 includes processor 520 to provide the digital control words to the current multipliers. Processor 520 can be any type of suitable processor capable of providing digital control words. Examples include, but are not limited to, microcontrollers, digital signal processors, and microprocessors. In some embodiments, processor 520 is omitted. In some of these embodiments, registers are used to hold the digital control words. The registers can be loaded using any known mechanism, including as memory-mapped peripherals, scan chains, or the like.

Each V-I converter in integrated circuit 500 is coupled to a corresponding current multiplier. For example, V-I converter 502 is coupled to current multiplier 504 and V-I converter 506 is coupled to current multiplier 508. Two V-I converters and current multipliers are shown in FIG. 5. In some embodiments, more than two V-I converters and current multipliers exist. In these embodiments, more than two input voltages are received, and more than two differential currents are summed at the load devices. Any number of V-I converters and current multipliers can exist in parallel without departing from the scope of the present invention.

The various voltage multiplier embodiments described herein operate with good linearity and at high frequencies. In some embodiments with power supply values of 1.6 volts, good linearity is achieved over a differential input voltage swing of 0.8 volts. Also in some embodiments, settling times are on the order of a few hundred picoseconds.

Integrated circuits 200 (FIG. 2) and 500 (FIG. 5) can be any integrated circuit capable of including any of the voltage multiplier circuit embodiments described herein. Integrated circuits 200 and 500 can be a processor such as a microprocessor, a digital signal processor, a microcontroller, or the like. Integrated circuits 200 and 500 can also be an integrated circuit other than a processor such as an application-specific integrated circuit (ASIC), a processor peripheral, a communications device, a memory controller, or a memory such as a dynamic random access memory (DRAM).

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A circuit comprising:
  a voltage-to-current converter having a differential input node and a differential output node;
  a current multiplier coupled to the differential output node of the voltage-to-current converter circuit and including an output node;
  a load device coupled to the output node of the current multiplier;
  a second voltage-to-current converter having a differential input node and a differential output node; and
  a second current multiplier coupled to the differential output node of the second voltage-to-current converter;
  wherein the current multiplier and the second current multiplier each have differential output nodes coupled in common.

2. The circuit of claim 1 further comprising a pair of loads coupled to the differential output nodes of the current multiplier and the second current multiplier to develop a differential output voltage.

3. The circuit of claim 1 wherein the current multiplier comprises:
  a diode-connected control transistor; and
  a plurality of selectable current source circuits coupled to the diode-connected control transistor.

4. The circuit of claim 3 wherein each of the plurality of selectable current source circuits includes:
  a current source transistor having a gate; and
  a select transistor coupled source-to-drain between a gate of the diode-connected control transistor and the gate of the current source transistor.

5. A circuit comprising:
  a voltage-to-current converter having a differential input node and a differential output node;
  a current multiplier coupled to the differential output node of the voltage-to-current converter circuit, the current multiplier includes a plurality of selectable current source circuits to provide a digitally controlled programmable gain;
  a second voltage-to-current converter; and
  a second current multiplier having a digitally programmable current gain, the second current multiplier coupled to be responsive to the second voltage-to-current converter circuit and having an output node coupled in common with an output node of the current multiplier.

6. A circuit comprising:
  a plurality of voltage-to-current converters having differential input nodes and differential output nodes; and
  a plurality of current multipliers, each including a plurality of current source circuits to provide a digitally controlled programmable gain,
  each of the plurality of voltage-to-current converters being coupled to a corresponding one of the plurality of current multipliers, and wherein the plurality of current multipliers have output nodes coupled in common.

7. The circuit of claim 6 further comprising a load device coupled to the output nodes coupled in common.

8. A circuit comprising:
  a differential pair of input transistors to convert a differential input voltage into a first differential current;
  a current multiplier coupled to the differential pair of transistors to produce a second differential current in response to the first differential current, the current multiplier including a plurality of selectable current source circuits, and wherein each of the plurality of selectable current source circuits is configured to be responsive to a digital control signal; and
  a pair of load devices to produce a differential output voltage in response to the second differential current.

9. A circuit comprising:
  a differential pair of input transistors to convert a differential input voltage into a first differential current;
  a current multiplier coupled to the differential pair of transistors to produce a second differential current in response to the first differential current; and
  a pair of load devices to produce a differential output voltage in response to the second differential current;
  a second differential pair of transistors to receive a second differential input voltage; and
  a second current multiplier coupled between the second differential pair of transistors and the pair of load devices.

10. The circuit of claim 9 wherein the second current multiplier is configured to vary a differential output current in response to a second set of digital control signals.

11. An integrated circuit comprising a voltage multiplier circuit that includes a current multiplier with a digitally programmable current gain;
  a voltage-to-current converter circuit coupled to an input side of the current multiplier; and
  a processor coupled to the current multiplier to provide a digital value such that an output current of the current multiplier is responsive to the digital value and a voltage input to the voltage-to-current converter circuit.

12. An integrated circuit comprising a voltage multiplier circuit that includes a current multiplier with a digitally programmable current gain, the current multiplier comprising a plurality of current mirrors with digitally programmable gain, each of the plurality of current mirrors having a common output node; and
  a plurality of voltage-to-current converter circuits, wherein each of the plurality of voltage-to-current converter circuits is coupled to a corresponding one of the plurality of current mirrors.

13. The integrated circuit of claim 12 further comprising a load device coupled to the common output node to produce an output voltage from a sum of current mirror output currents.

14. An integrated circuit comprising:
  a plurality of voltage-to-current converters to receive a plurality of differential input voltages and produce a plurality of differential currents; and
  a plurality of current multipliers coupled to a common output node, each of the plurality of current multipliers coupled to a corresponding one of the plurality of voltage-to-current converters to receive a corresponding one of the plurality of differential currents, and wherein each of the plurality of current multipliers has a programmable current gain.

15. The integrated circuit of claim 14 wherein each of the plurality of current multipliers includes a digital input port to influence the programmable current gain.

16. The integrated circuit of claim 14 further comprising a processor coupled to the plurality of current multipliers to set the programmable current gain.

* * * * *